(12) United States Patent
Nishimura et al.

(10) Patent No.: US 12,261,548 B2
(45) Date of Patent: Mar. 25, 2025

(54) SETTING A STABLE OPERATING POINT AND EMI CONTROL OF AN H-BRIDGE OUTPUT STAGE

(71) Applicant: Analog Devices International Unlimited Company, Limerick (IE)

(72) Inventors: Naoaki Nishimura, Tokyo (JP); Abhishek Bandyopadhyay, Winchester, MA (US)

(73) Assignee: Analog Devices International Unlimited Company, Limerick (IE)

( * ) Notice: Subject to any disclaimer, the term of this patent is extended or adjusted under 35 U.S.C. 154(b) by 214 days.

(21) Appl. No.: 17/701,996

(22) Filed: Mar. 23, 2022

(65) Prior Publication Data
US 2022/0216804 A1    Jul. 7, 2022

Related U.S. Application Data

(63) Continuation of application No. PCT/EP2020/076661, filed on Sep. 24, 2020.
(Continued)

(51) Int. Cl.
*H02M 7/5387* (2007.01)
*H04B 3/50* (2006.01)

(52) U.S. Cl.
CPC ............ *H02M 7/5387* (2013.01); *H04B 3/50* (2013.01)

(58) Field of Classification Search
CPC ............ H02M 7/42; H02M 7/44; H02M 7/48; H02M 7/483; H02M 7/4833; H02M 7/4835; H02M 7/4837; H02M 7/487; H02M 7/49; H02M 7/515; H02M 7/521; H02M 7/53; H02M 7/537; H02M 7/5387; H02M 7/5395; H02M 1/0085; H02M 1/0095;
(Continued)

(56) References Cited

U.S. PATENT DOCUMENTS

| 7,746,123 B2 * | 6/2010 | Hester ............... H03K 17/164 |
|---|---|---|
| | | 327/170 |
| 9,590,610 B2 * | 3/2017 | Luo ..................... H03K 17/10 |

(Continued)

FOREIGN PATENT DOCUMENTS

| CN | 114424437 A | 4/2022 |
|---|---|---|
| DE | 112020004510 T5 | 6/2022 |

(Continued)

OTHER PUBLICATIONS

"International Application Serial No. PCT/EP2020/076661, International Preliminary Report on Patentability mailed Apr. 7, 2022", 8 pgs.

(Continued)

*Primary Examiner* — Thienvu V Tran
*Assistant Examiner* — Carlos O Rivera-Perez
(74) *Attorney, Agent, or Firm* — Schwegman Lundberg & Woessner, P.A.

(57) ABSTRACT

Apparatus and method for establishing a stable operating point of a H-bridge with a center shunt switch. The stable operating point lets a circuit connected to the H-bridge outputs work in a more ideal condition. As such, an H-bridge (Continued)

with a stable operating point will yield a higher performance and/or save power. Since common mode is one of the biggest sources of electromagnetic interference, a stable operating point in an H-bridge also suppresses EMI.

20 Claims, 15 Drawing Sheets

Related U.S. Application Data

(60) Provisional application No. 62/905,375, filed on Sep. 24, 2019.

(58) Field of Classification Search
CPC ............... H02M 1/12–15; H02M 1/32; H02M 1/34–348; H02M 1/44; H04B 3/00; H04B 3/50; H03F 1/00; H03F 1/30; H03F 1/301–304; H03F 3/00; H03F 3/45; H03F 3/45071; H03F 3/45179; H03F 3/4591; H03F 3/45636; H03F 3/217–2178; H03F 2200/00; H03F 2200/114
USPC .. 363/16, 17, 40, 41, 43, 50, 51, 55–58, 95, 363/98, 123, 131, 132, 135, 136; 323/266, 271–277, 282–285, 351, 907; 361/139, 140, 159; 330/10, 250, 251, 330/252–261
See application file for complete search history.

(56) References Cited

U.S. PATENT DOCUMENTS

| | | | |
|---|---|---|---|
| 2008/0310046 A1* | 12/2008 | Menegoli | G11B 21/02 360/75 |
| 2009/0243722 A1 | 10/2009 | Liu et al. | |
| 2013/0300500 A1 | 11/2013 | Holzmann | |
| 2015/0109055 A1 | 4/2015 | Botti | |
| 2019/0007011 A1* | 1/2019 | Berkhout | H03M 3/456 |

FOREIGN PATENT DOCUMENTS

| | | |
|---|---|---|
| EP | 3422570 A1 | 1/2019 |
| WO | WO-2021058623 A1 | 4/2021 |

OTHER PUBLICATIONS

"International Application Serial No. PCT/EP2020/076661, International Search Report mailed Jan. 11, 2021", 4 pgs.
"International Application Serial No. PCT/EP2020/076661, Written Opinion mailed Jan. 11, 2021", 6 pgs.

* cited by examiner

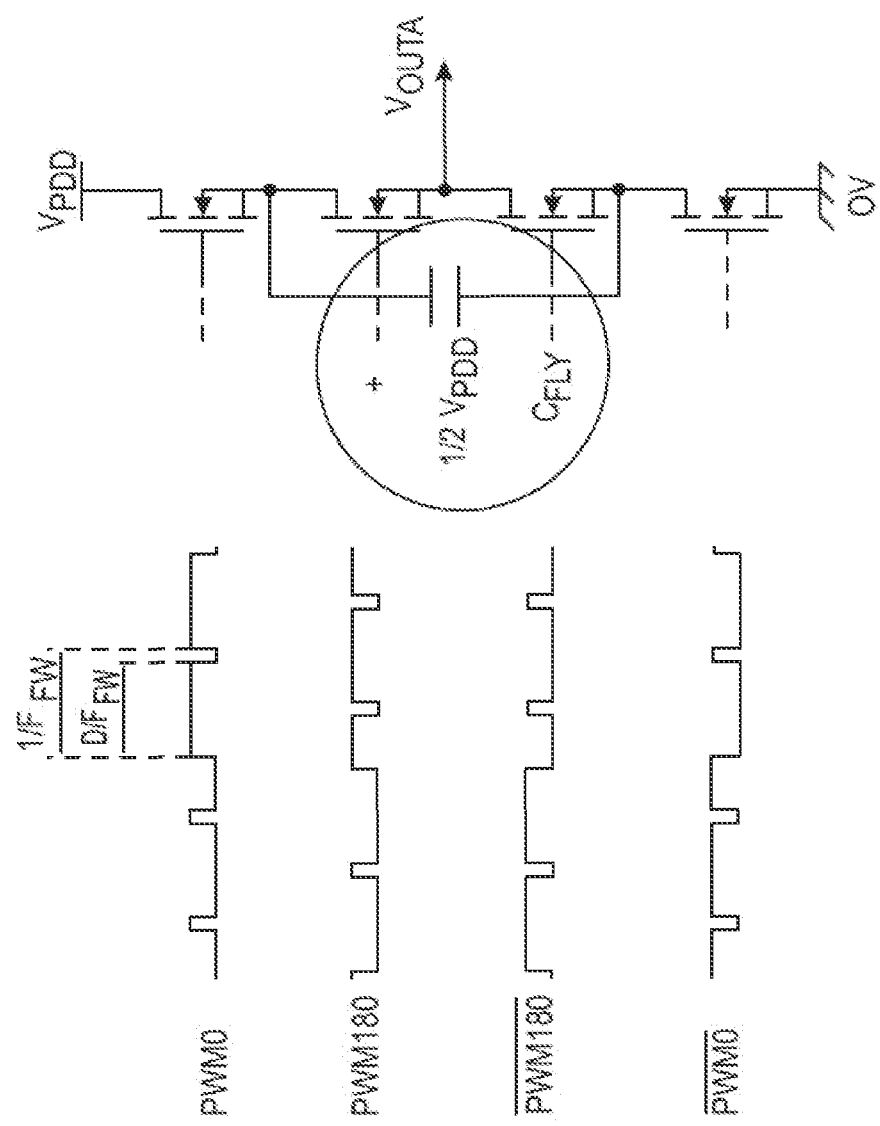

SETTING A STABLE OPERATING POINT AND EMI CONTROL OF AN H-BRIDGE OUTPUT STAGE

CROSS-REFERENCE TO RELATED APPLICATIONS

This application is related to and claims the benefit of priority under 35 U.S.C. § 119(e) to International Patent Application No. PCT/EP2020/076661 entitled, "SETTING A STABLE OPERATING POINT AND EMI CONTROL OF AN H-BRIDGE OUTPUT STAGE" filed Sep. 24, 2020 and U.S. Provisional Patent Application No. 62/905,375 entitled, "SETTING A STABLE OPERATING POINT AND EMI CONTROL OF AN H-BRIDGE OUTPUT STAGE" filed on Sep. 24, 2019, which are hereby incorporated by reference in their entirety.

FIELD OF THE DISCLOSURE

The present disclosure relates to differential H-bridge circuits. More specifically, this disclosure describes mid-switches to control the common mode and set a stable operating point in an H-bridge circuit.

BACKGROUND

Differential signaling is a method for electrically transmitting information using two complementary signals. The technique sends the same electrical signal as a differential pair of signals, each in its own conductor. The pair of conductors can be wires (typically twisted together) or traces on a circuit board. The receiving circuit responds to the electrical difference between the two signals, rather than the difference between a single wire and ground. The opposite technique is called single-ended signaling. Differential pairs are usually found on printed circuit boards, in twisted-pair and ribbon cables, and in connectors.

Differential signaling is a way of transmitting a differential signal from a transmitter to a receiver via a differential transmission line, e.g., via a pair of wires, e.g., copper wires. A differential signaling driver circuit drives an electrical current through the transmission line in accordance with a driver signal. The electrical current in the transmission line is referred to herein as the signal current. The driver signal may, for example, be provided by a voltage, an electrical current or any other suitable physical quantity.

A differential signaling receiver circuit may comprise a resistive bridge connected across the differential output of the transmission line, i.e., between the two conductors of the transmission line at the end of the transmission line. The electrical current injected into the transmission line by the differential signaling driver circuit thus translates into a voltage across the resistive bridge at the end of the transmission line. This voltage may be further processed or analyzed by the differential signaling receiver circuit or by circuitry connected to the differential signaling receiver circuit.

The driver signal is usually a bi-level signal, i.e. a binary signal. However, a differential signaling driver circuit may, in principle, be capable of translating any kind of waveform of the driver signal into a corresponding waveform of the signal current. In other words, a differential signaling driver circuit may be suitable for both continuous (i.e., analog) and discrete (i.e., digital) driver signals.

Differential signaling may be performed in a low-voltage manner when a differential signal of low voltage amplitude is superimposed on a common mode DC voltage. For example, a differential signal with a maximum amplitude of 0.5 V or less, e.g. 350 mV may be imposed on a common mode voltage of 1.5 V or less, such as 1.2 V or less, e.g. 0.9 V or less, e.g. 0.4 V. This is generally referred to as low-voltage differential signaling.

Low-voltage differential signaling, or LVDS, is a technical standard that specifies electrical characteristics of a differential, serial signaling standard, but it is not a protocol. LVDS operates at low power and can run at very high speeds using inexpensive twisted-pair copper cables. LVDS is a physical layer specification only; many data communication standards and applications use it and add a data link layer as defined in the OSI model on top of it.

As stated, LVDS is a differential signaling system, meaning that it transmits information as the difference between the voltages on a pair of wires; the two wire voltages are compared at the receiver. In LVDS, differential signals are transmitted from a transmitting terminal, and the two signal lines are terminated each other by a resistor at a receiving terminal. Binary data of "0" or "1" is generated and transmitted by changing the directions of the currents of the differential signals. At the receiving terminal, a differential amplifier determines a signal value by sensing a higher voltage side of the resistor.

One of the advantages of LVDS is reduction of electromagnetic emission. This is because the current flows in opposite directions through the pair wires for transmitting the signals, and the binary data "0" and "1" are different only in current direction and are equal in current amount. In addition, voltages caused by the resistor at the end of the wires do not change, although higher side of the signal lines changes depending on the signal values "0" or "1". This also leads to a lower amount of electromagnetic emission.

However, the amount of electromagnetic emission is reduced only when the differential signals on the pair wires are switched substantially ideally. Actually, on switching the differential signals, there is a possibility that voltages of the signals are changed unequally or the directions of the currents flowing through the wires not change smoothly. They are mainly caused by a difference of ON/OFF timing in a plurality of transistors for generating the differential signals.

Depending on variations in manufacturing accuracy of a printed circuit, and variations in material, a delay time difference takes place between two transmission lines. The delay time difference between the two transmission lines is not so problematic when the bit rate is low. The higher the bit rate, the more severe the waveform distortion of a transmission signal becomes.

In particular, if a high-speed transmission or higher is performed, a time width of a signal waveform becomes short, and a delay time difference in excess of 1 unit interval (UI: one period of a bit clock) can take place over a travel distance of about tens of centimeters over a printed board. As a result, a margin of the time delay difference between the differential signals is reduced, and it is difficult to receive correctly a data signal. As a preventive step, a technique of detecting and then compensating for a skew of the differential signals on the receiver is used.

If the delay time difference is large between the transmission paths for transferring the differential signals in the above-described related art, it is difficult to maintain a differential state between the differential signals received by the receiver. It is thus difficult to detect the skew (phase difference) of the differential signals. The compensation for the skew of the differential signals is thus difficult, and an erratic operation may take place in a subsequent circuit of the receiver.

The inventors of the present invention have recognized a long felt need to control the common mode in robust and energy efficient way. This is accomplished in a common mode feedback approach which is highly versatile and can be applied to several applications.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY OF THE DISCLOSURE

Apparatus and method for establishing a stable operating point of a H-bridge with a center shunt switch. The stable operating point lets a circuit connected to the H-bridge outputs work in more ideal condition. As such, an H-bridge with a stable operating point will yield a higher performance and/or save power. Since common mode is one of the biggest sources of electromagnetic interference, a stable operating point in an H-bridge also suppresses EMI.

According to one aspect, a circuit for setting a stable operating point includes: a first half bridge having a first output; a second half bridge having a second output; a shunt switch in electrical communication with the first and second outputs; a common mode voltage source; a first resistor and first switch disposed between the first output and common mode voltage source; and a second resistor and second switch disposed between the second output and common mode voltage source.

According to another aspect, a system for setting a stable operating point in an H-bridge circuit includes: an IDAC; a modulator in electrical communication with the IDAC; and an H-bridge comprising: a first half bridge having a first output; a second half bridge having a second output; a shunt switch in electrical communication with the first and second outputs.

According to another aspect, a system for setting a stable operating point includes: an IDAC; an integrator coupled to the IDAC configured to receive an IDAC output and a feedback signal; a quantizer coupled to the integrator configured to receive and integrator output and generate a quantized signal; and an H-bridge configured to receive the quantized signal, comprising: a first half bridge having a first output; a second half bridge having a second output; and means for stabilizing an operating point of the H-bridge. In some implementations, the means for stabilizing the operating point include a shunt switch in electrical communication with the first and second outputs.

In some implementations, the system includes a common mode voltage source; a first resistor and first switch disposed between the first output and the common mode voltage source; and a second resistor and second switch disposed between the second output and the common mode voltage source.

The drawings show exemplary common mode stabilization for differential switching output circuits and configurations. Variations of these circuits, for example, changing the positions of, adding, or removing certain elements from the circuits are not beyond the scope of the present invention. The illustrated power stages, configurations, and complementary devices are intended to be complementary to the support found in the detailed description.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which:

FIG. 2A shows exemplary signaling in a FC 3-level half bridge, in accordance with some embodiments of the disclosure provided herein;

FIG. 2B shows an exemplary FC 3-level half bridge, in accordance with some embodiments of the disclosure provided herein;

DETAILED DESCRIPTION

The present disclosure relates to differential H-bridge circuits. More specifically, this disclosure describes mid-switches to control the common mode and set a stable operating point in an H-bridge circuit and mitigate EMI. In some embodiments, mid-switch networks are introduced with common-mode feedback (CMFB), modulators, and integrators in differential signaling and other audio applications.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

Embodiments herein relate to a way to establish a very stable operating point of an H-bridge with a center shunt switch. The stable operating point may let a circuit connected to the H-bridge outputs work in a more ideal condition, hence higher performance and/or save power. This stable operating point may lower EMI as well since a common mode which is one of a biggest source of an EMI is well suppressed.

Generally, it may be hard to realize output stage which meets all of: Multiple output level; Stable common mode on vdd/2; and Single voltage supply and no external reservoir capacitor.

In case of 2-level switching stage, the conventional SW output stage has 2-level output level: VDD or GND; and ripple current flows into a filtering inductor tend to be larger.

In case of 3-level or multiple-level implementation, there may be several ways to have multiple level. One such technique may be a 3-level half bridge with a common mode (CM) of the output stage is VDD/2. This technique may need an external cap or multiple power supply. Another such technique may be a 3-level H-bridge. In this technique, CM may be moving around between VDD-GND. A feedback amplifier may be subjected to the large CM range and facing a design difficulty. The CM Variation may introduce EMI.

Multi-level half-bridges can be made in several different ways. One method employs multiple power supplies which directly imparts positive/negative/neutral signals to implement to a 3-level output. In numeral arts and applications, single sided supply is preferred, as a designer cannot always expect multiple sets of power supply. Single sided implementations will down be discussed in more detail.

Figure 1A:
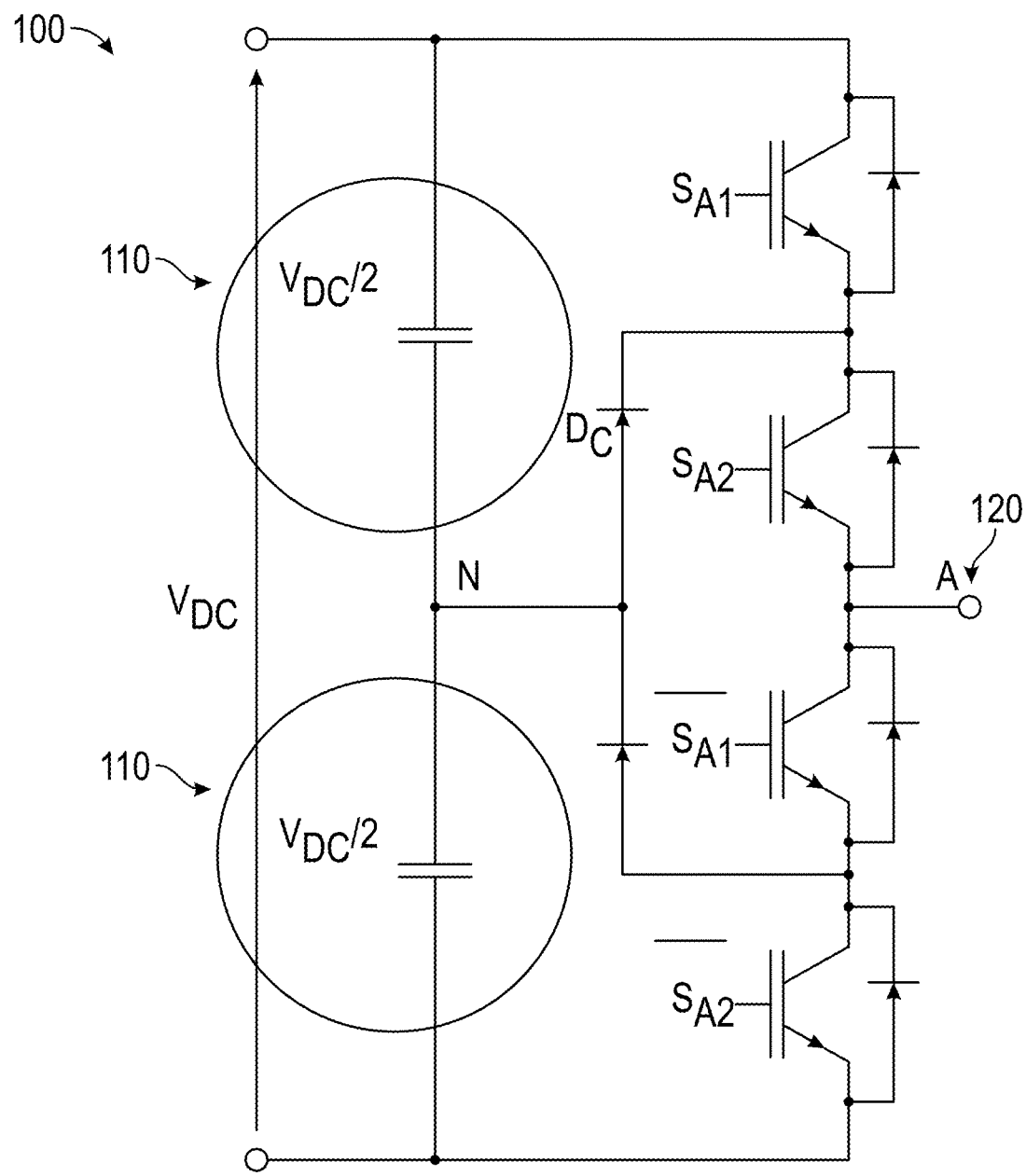
FIG. 1A shows an exemplary NPC 3-level half bridge, in accordance with some embodiments of the disclosure provided herein.

FIG. 1A shows an exemplary Neutral Point Clamped (NPC) 3-level half bridge, in accordance with some embodiments of the disclosure provided herein. NPC 3-level half bridge 100 comprises divider capacitors 110, diodes and transistors in a network which provides for multi-level clamped output 120.

In one or more embodiments, NPC 3-level half bridge 100 is a diode Clamped Multilevel Inverter. The main object of this inverter is to use diodes and provides the multiple voltage levels through the different phases to the capacitor banks which are in series. A diode transfers a limited amount of voltage, thereby reducing the stress on other electrical devices.

The maximum output voltage is half of the input DC voltage. It is the main drawback of the diode clamped multilevel inverter. This problem can be solved by increasing the switches, diodes, capacitors. Due to the capacitor balancing issues, these are limited to the three levels. This type of inverters provides high efficiency because of the fundamental frequency used for all the switching devices and it is a simple method of the back to back power transfer systems.

Figure 1B:
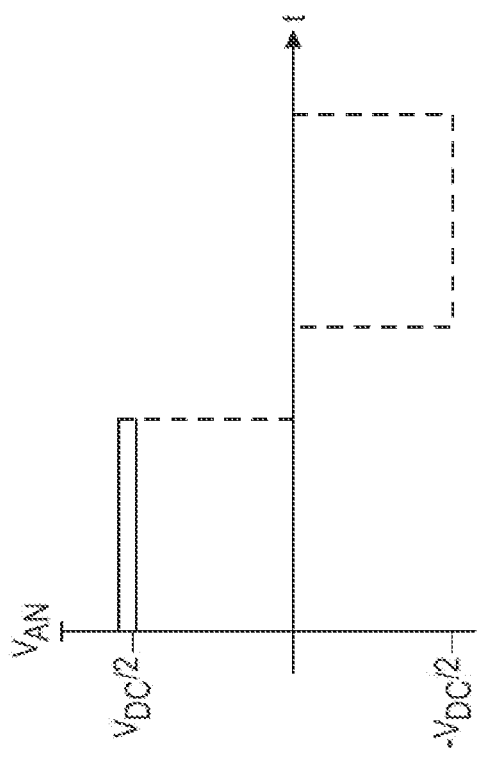
FIG. 1B shows an exemplary graph illustrating the output of an NPC 3-level half bridge, in accordance with some embodiments of the disclosure provided herein.

FIG. 1B shows an exemplary graph illustrating the output of an NPC 3-level half bridge 100, in accordance with some embodiments of the disclosure provided herein. The resultant output can be appreciated by one skilled in the art. In practice, divider capacitors 110 create voltage ladder necessary to produce the positive/negative outputs of $V_{dc}/2$ on multi-level clamped output 120.

Figure 1C:
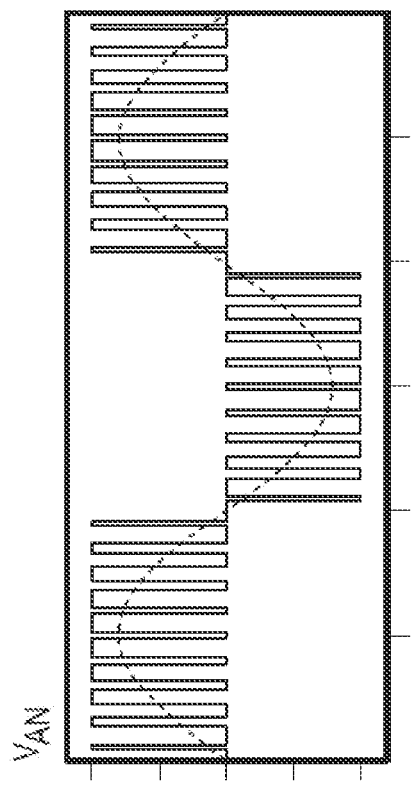
FIG. 1C shows an exemplary graph illustrating the output of an NPC 3-level half bridge during PWM, in accordance with some embodiments of the disclosure provided herein.

FIG. 1C shows an exemplary graph illustrating the output 120 of an NPC 3-level half bridge 100 during PWM, in accordance with some embodiments of the disclosure provided herein. FIG. 1C illustrates an exemplary graph of pulse width modulation (PWM) and resultant analog counterparts from a 2-level signaling system.

As one skilled in art can appreciate, the present disclosure is readily applied to pulse width modulation (PWM) and class-D amplifiers, in one or more embodiments. Pulse-width modulation (PWM), or pulse-duration modulation (PDM), is a method of reducing the average power delivered by an electrical signal, by effectively chopping it up into discrete parts.

The average value of voltage (and current) fed to the load is controlled by turning the switch between supply and load on and off at a fast rate. The longer the switch is on compared to the off periods, the higher the total power supplied to the load. Along with maximum power point tracking (MPPT), it is one of the primary methods of reducing the output of solar panels to that which can be utilized by a battery. PWM is particularly suited for running inertial loads such as motors, which are not as easily affected by this discrete switching, because their inertia causes them to react slowly. The PWM switching frequency has to be high enough not to affect the load, which is to say that the resultant waveform perceived by the load must be as smooth as possible.

The rate (or frequency) at which the power supply must switch can vary greatly depending on load and application. For example, switching has to be done several times a minute in an electric stove; 120 Hz in a lamp dimmer; between a few kilohertz (kHz) and tens of kHz for a motor drive; and well into the tens or hundreds of kHz in audio amplifiers and computer power supplies.

The main advantage of PWM is that power loss in the switching devices is very low. When a switch is off there is practically no current, and when it is on and power is being transferred to the load, there is almost no voltage drop across the switch. Power loss, being the product of voltage and current, is thus in both cases close to zero. PWM also works well with digital controls, which, because of their on/off nature, can easily set the needed duty cycle. PWM has also been used in certain communication systems where its duty cycle has been used to convey information over a communications channel.

A class-D amplifier or switching amplifier is an electronic amplifier in which the amplifying devices (transistors, usually MOSFETs) operate as electronic switches, and not as linear gain devices as in other amplifiers. They operate by rapidly switching back and forth between the supply rails, being fed by a modulator using pulse width, pulse density, or related techniques to encode the audio input into a pulse train. The audio escapes through a simple low-pass filter into the loudspeaker. The high-frequency pulses are blocked. Since the pairs of output transistors are never conducting at the same time, there is no other path for current flow apart from the low-pass filter/loudspeaker. For this reason, efficiency can exceed 90%.

FIG. 2A shows exemplary signaling in a Flying Capacitor (FC) 3-level half bridge, in accordance with some embodiments of the disclosure provided herein. One skilled in the will appreciate that FIG. 2A depicts fours typical outputs in an FC 3-level half bridge. That is PWM0, PWM180 and their complements.

FIG. 2B shows an exemplary FC 3-level half bridge, in accordance with some embodiments of the disclosure provided herein. FC 3-level half bridge is a Flying Capacitors Multilevel Inverter, according to the present embodiment.

The main object of this inverter is to use capacitors. It is of a series connection of capacitor clamped switching cells. The capacitors transfer the limited amount of voltage to electrical devices. In this inverter, switching states are like in the diode clamped inverter. Clamping diodes are not required in this type of multilevel inverters.

The output is half of the input DC voltage. It is a drawback of the flying capacitors multilevel inverter. It also has the switching redundancy within the phase to balance the flying capacitors. It can control both the active and reactive power flow. But due to the high-frequency switching, switching losses will take place.

Figure 2C:
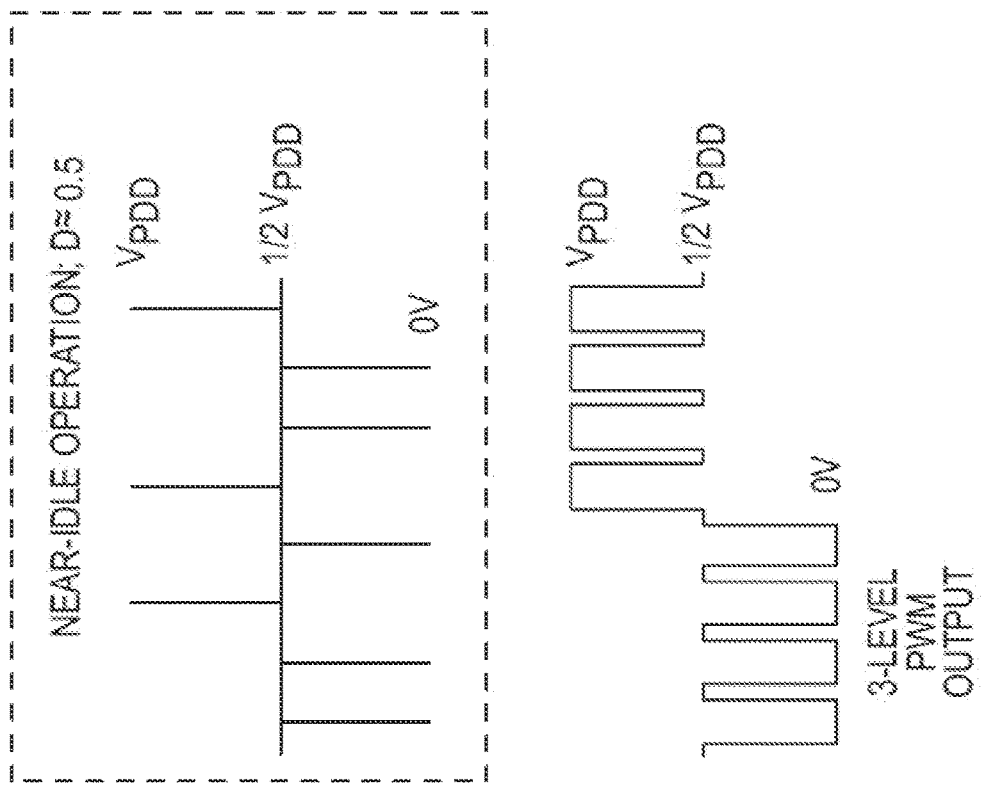
FIG. 2C shows an exemplary graph illustrating the output of a FC 3-level half bridge during PWM, in accordance with some embodiments of the disclosure provided herein.

FIG. 2C shows an exemplary graph illustrating the output of a FC 3-level half bridge during PWM, in accordance with some embodiments of the disclosure provided herein. Near-idle operation demonstrates low power losses during this mode. Whereas, FIG. 2C also shows potential power loss during nominal 3-level PWM operation. A large capacitor which is hard to implement in silicon.

Alternatively, there is an increased cost of inclusion into a printed circuit board (PCB) in terms of area and parts cost. Some of the disadvantages of Flying Cap includes needing a large value external capacitor which virtually works as Vdd/2 voltage source. Accordingly, if the capacitor value is too large, fabrication precludes its inclusion onto a silicon die.

FIG. 3A-3D are an exemplary circuit showing a 3-level differential output by using an H-bridge, in accordance with some embodiments of the disclosure provided herein. In FIGS. 3A-3D, the H-bridge has 4 transistors. In one example, a resistor is connected as a load. FIGS. 3A-3D show four different states of the circuit.

According to various implementations, the circuit shown FIGS. 3A-3D includes 3-level (Positive, Negative and Zero) outputs in terms of differential voltage across the load. Each FIG. 3A-3D includes an arrow showing the current path during each state.

Figure 3B:
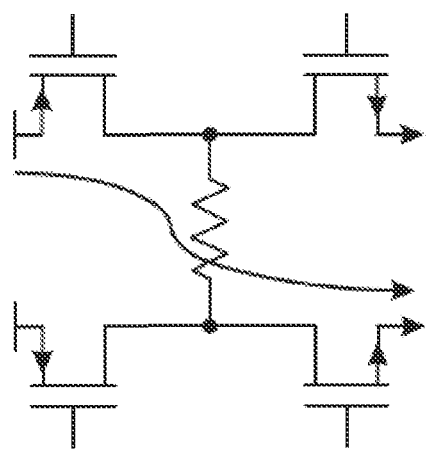
FIG. 3B is an exemplary circuit demonstrating current path, in accordance with some embodiments of the disclosure provided herein.
Figure 3A:
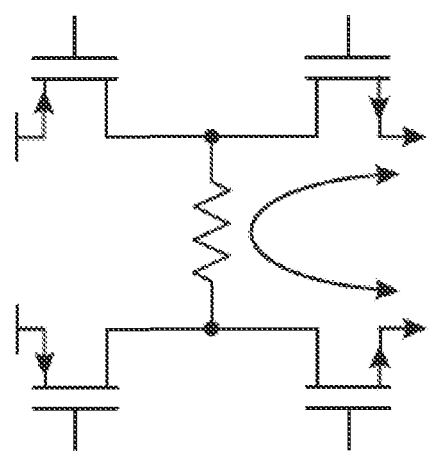
FIG. 3A is an exemplary circuit demonstrating current path, in accordance with some embodiments of the disclosure provided herein.

FIG. 3A shows a zero level signaling output, in accordance with some embodiments of the disclosure provided herein. Both low side switches are on. Both terminals of the load are set to GND, thus a differential output voltage across the load is zero. The common mode voltage of the two outputs is GND. A load current is circulating inside the loop formed by the two low side switches and the load.

In one or more embodiments, common mode is current moving between supply rail and ground. In some examples, it represents the voltage disparity pmos and nmos transistors (in CMOS example) when with resistances from either timing and/or manufacturing. As a result, feedback amplifier can be subjected to undesirable large common-mode motion (swings).

FIG. 3B is an exemplary circuit showing a negative level signaling output, in accordance with some embodiments of the disclosure provided herein. As shown in FIG. 3B, the right high side and left low side switches are on. The right terminal of the load is set to VDD and the left terminal of the load is set to GND. Thus, the differential output voltage across the load is GND-VDD. The common mode voltage of the two outputs is VDD/2. A load current is passing through the path formed by the high-side switch, the load, and the low-side switch.

Figure 3C:
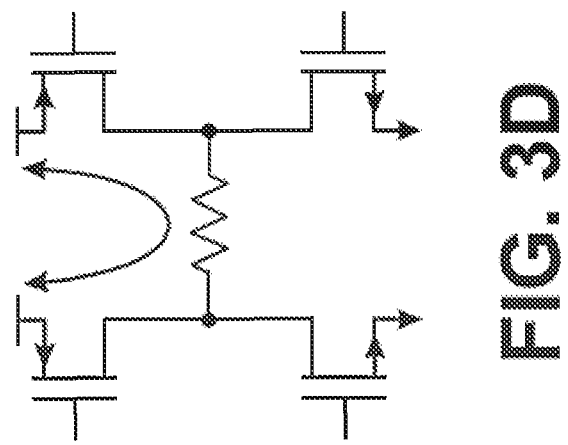
FIG. 3C is an exemplary circuit demonstrating current path, in accordance with some embodiments of the disclosure provided herein.

FIG. 3C is an exemplary circuit showing the positive level signaling output, in accordance with some embodiments of the disclosure provided herein. The left high side and the right low side switches are on. The left terminal of the load is set to VDD and the right terminal of the load is set to GND, thus the differential output voltage across the load is VDD-GND. The common mode voltage of the two outputs is VDD/2. A load current is passing through the path formed by high-side switch, load and low-side switch.

Figure 3D:
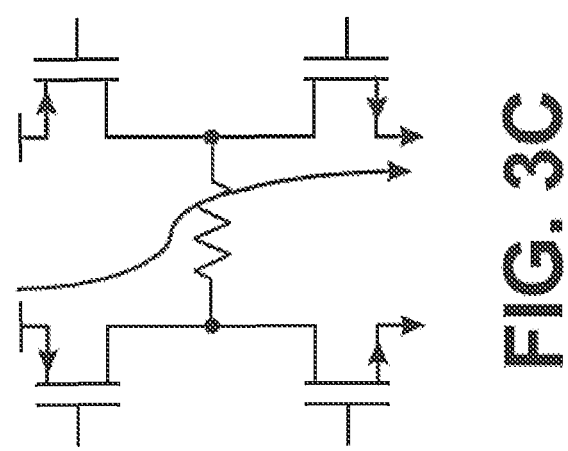
FIG. 3D is an exemplary circuit demonstrating current path, in accordance with some embodiments of the disclosure provided herein.

FIG. 3D is an exemplary circuit showing a zero level signaling output, in accordance with some embodiments of the disclosure provided herein. Both high side switches are on, and both terminals of the load are set to VDD. Thus, the differential output voltage across the load is zero. Common mode voltage of the two outputs is VDD. A load current is circulating inside the loop formed by the two high side switches and the load.

As shown in FIGS. 3A-3D, zero output is expressed either by both setting low sides to GND (FIG. 3A) or by setting both high sides to VDD(d). With positive and negative classical 2-level output (FIGS. 3B and 3C), the circuit can have 3-level differential output states. In some examples, one drawback of the circuit is that the common mode does not statically stay on the VDD/2. According to various implementations, the common mode can change between VDD, GND, and VDD/2, depending on the state and, potentially, depending on a source of electromagnetic interference (EMI). In some examples, taking the differential signal from the output for feedback can be hard because the feedback amplifier is subjected to the large swing of the common mode. This common mode variation is one drawback of the method.

Figure 4:
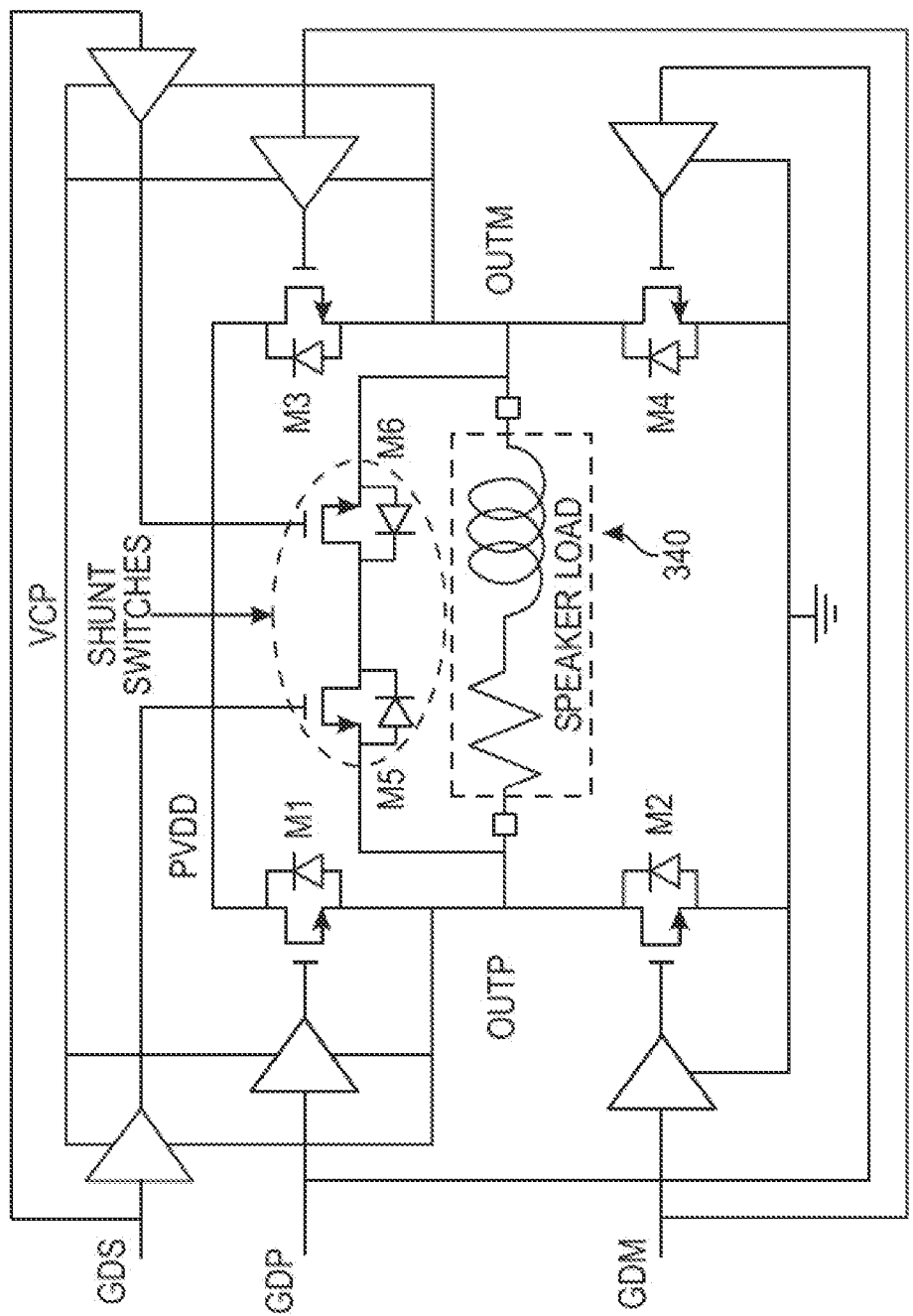
FIG. 4 is an exemplary circuit demonstrating common-mode free binary modulation, in accordance with some embodiments of the disclosure provided herein.

FIG. 4 is an exemplary circuit demonstrating common-mode free binary modulation, in accordance with some embodiments of the disclosure provided herein. This is an example of output stage with center shunt device, but without any common mode feedback system.

Figure 5:
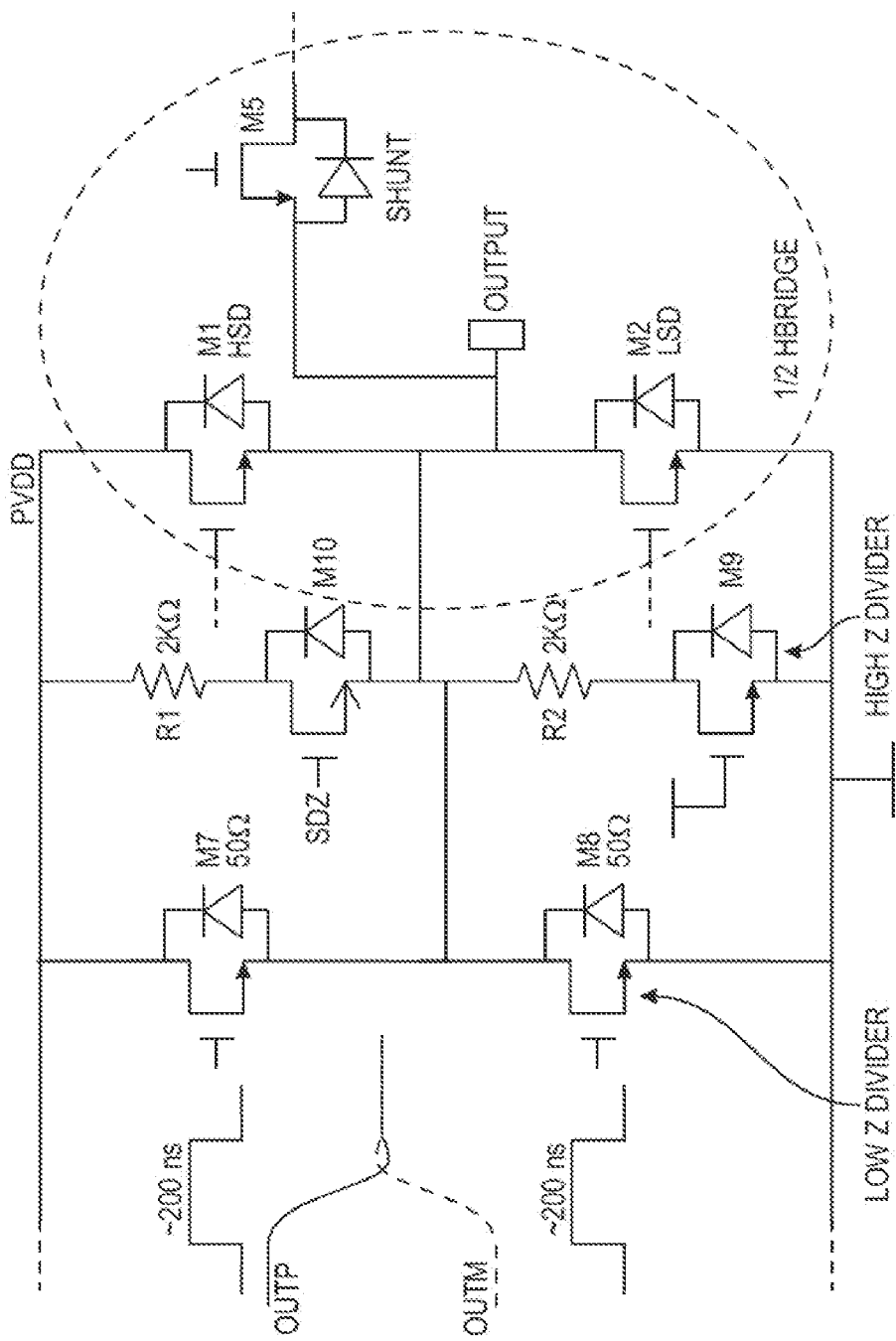
FIG. 5 is an exemplary circuit demonstrating common-mode shunt switching, in accordance with some embodiments of the disclosure provided herein.

FIG. 5 is an exemplary circuit demonstrating a common-mode setting, in accordance with some embodiments of the disclosure provided herein. In particular, FIG. 5 shows a detailed left half of a circuit shown in FIG. 4. FIG. 5 demonstrates a method for setting the common mode during zero differential output. During the zero output state, M5 is on, and M1 and M2 are off. To set the OUTPUT voltage referring to GND, there are two parallel output half-bridges: a first parallel output half-bridge is a high impedance half-bridge including R1, R2, M9 and M10, and a second parallel output half-bridge is a low impedance half-bridge including M7 and M8. During the zero output state, the low impedance half-bridge is turned on briefly and the high impedance half-bridge is kept on for setting the OUTPUT voltage to VDD/2. This helps keep the outputs from flying to the supply rail and exhausting power. In one implementation, the transistors M1 and M2 are turned on and off such that the resistance of M1 and M2 match during the transition period. If one resistor is higher than the other, the common mode veers out from VDD/2 and can be an electromagnetic interference (EMI) source. Matching the resistance of M1 and M2 tends to make the gate driving circuit complicated and the transition speed slower. It can also consume additional power.

Figure 6:
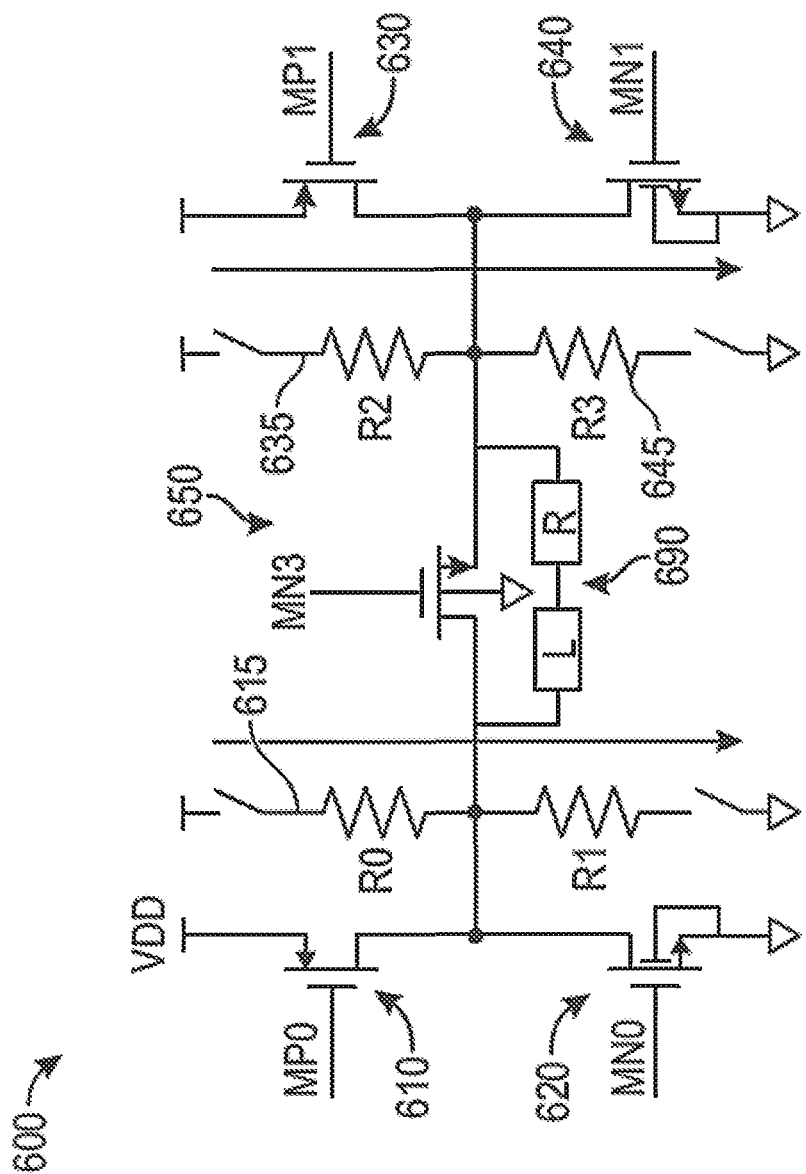
FIG. 6 is an exemplary circuit demonstrating common-mode control, in accordance with some embodiments of the disclosure provided herein.

FIG. 6 is an example of a simplified circuit of FIGS. 4 and 5 exemplifying common-mode control using a mid-switch, in accordance with some embodiments of the disclosure provided herein. H-bridge circuit 600 comprises transistor mp0 610, transistor mn0 620, transistor mp1 630, transitory mn1 640, mid-switch mn3 650, load 690, resistor r0 615, resistor r1 625, resistor r2 635, and resistor r4 645. In some examples, the load 690 is a series connection of inductors L and resister R, which is an equivalent load for class-D applications.

In one or more embodiments, the transistors are mosfets; however, any transistor or suitable switch in not beyond the scope of the present disclosure. As is known in the art, the present embodiment could be considered two half bridges or an H-bridge. However, an H-bridge typically has the load between the two half bridges. Whereas, differential outputs in the present embodiments are taken at the midpoint in the left and right half bridges.

FIG. 6 has 3-level outputs (Positive, Negative and Zero) in terms of differential voltage across the load 690. In one example, when positive, mp0 and mn1 are ON. The left terminal of the load is connected to VDD and the right terminal of the load is connected to GND. Thus, the voltage across the load is VDD-GND. In one example, when negative, mp1 and mn0 are ON. The left terminal of the load is connected to GND and the right terminal of the load is connected to VDD. Thus, voltage across the load is GND-VDD. In these examples for positive and negative cases, common mode of the outputs is set by VDD/2, because if one output is VDD, the other output is GND.

During the zero output, mn3 is ON. Voltage across the load becomes zero. Because the circuit formed by mn3 and load is floating from the VDD/GND rail, the voltage of the circuit is set relative to VDD/GND.

To set the common mode of the load, FIG. 6 includes a pair of resistor strings (r0, r1 and r2, r3) between VDD/GND and forcing outputs to VDD/2. Even with switches in series with resistor r0 615, resistor r1 625, resistor r2 635, and resistor r4 645, power is undesirably consumed. Also, being that resistor r0 615, resistor r1 625, resistor r2 635, and resistor r4 645 are all in parallel with the load 690 voltage swings from the current will be reduced. In the present embodiment, switches are closed when the transistor mn3 is on.

Figure 7:
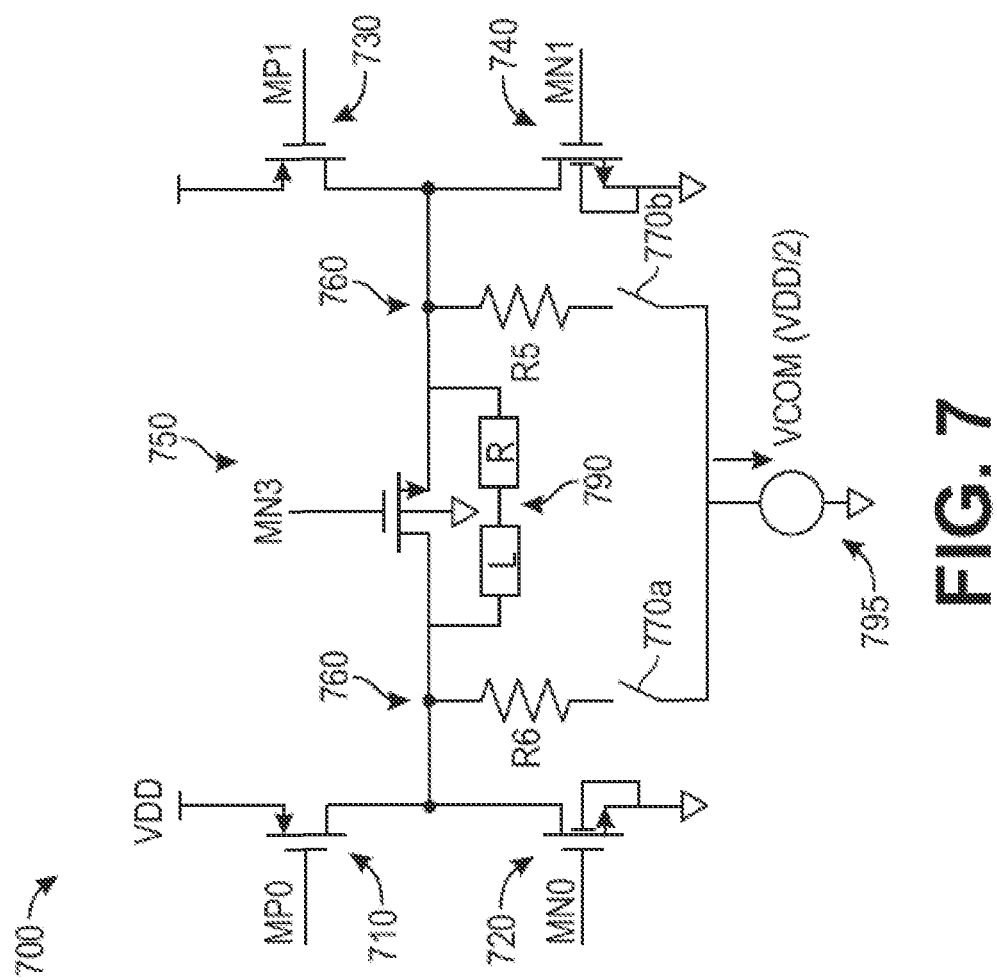
FIG. 7 is an exemplary circuit demonstrating common-mode control using a mid-switch, in accordance with some embodiments of the disclosure provided herein.

FIG. 7 is an exemplary circuit demonstrating common-mode control using a mid-switch, in accordance with some embodiments of the disclosure provided herein. H-bridge circuit 700 comprises transistor mp0 710, transistor mn0 720, transistor mp1 730, transitory mn1 740, mid-switch mn3 750, load 790, resistor r5, r6 760, switches 770 and voltage source 795. The load 790 is a series connection of inductors L and resistor R, which is a typical equivalent load for class-D applications.

FIG. 7 has 3-level outputs (Positive, Negative and Zero) in terms of differential voltage across the load 790. In one example, when positive, mp0 and mn1 are ON. The left terminal of the load is connected to VDD and the right terminal of the load is connected to GND. Thus, the voltage across the load is VDD-GND. In one example, when negative, mp1 and mn0 are ON. The left terminal of the load is connected to GND and the right terminal of the load is connected to VDD. Thus, voltage across the load is GND-VDD. In these examples for positive and negative cases, common mode of the outputs is set by VDD/2, because if one output is VDD, the other output is GND.

During the zero output, mn3 is ON. Voltage across the load becomes zero. Because the circuit formed by mn3 and load is floating from the VDD/GND rail, the voltage of the circuit is set relative to VDD/GND.

FIG. 7 depicts an example technique for settling common mode. During the Zero output, mn3 750 is on, and mp0, mp1, mn0 and mn1 are off. In one example, the common mode is set by a voltage source (Vcom) and two resistors (r5, r6) to outputs 760. A circuit formed by mn3 750 and load 790 is floating from the VDD/GND rail, easily forcing the outputs to Vcom. The power efficiency may be increased as no DC current flow into Vcom after charging parasitic capacitors on the outputs to a desired value (typically VDD/2). Switches 770a and 770b are on during the third leveling position. In some examples, the switches 770a, 770b are open during other leveling positions to save power, by preventing current running.

In some embodiments, the mid-switch (e.g., mn3 750) is made from multiple series switch devices.

Figure 8:
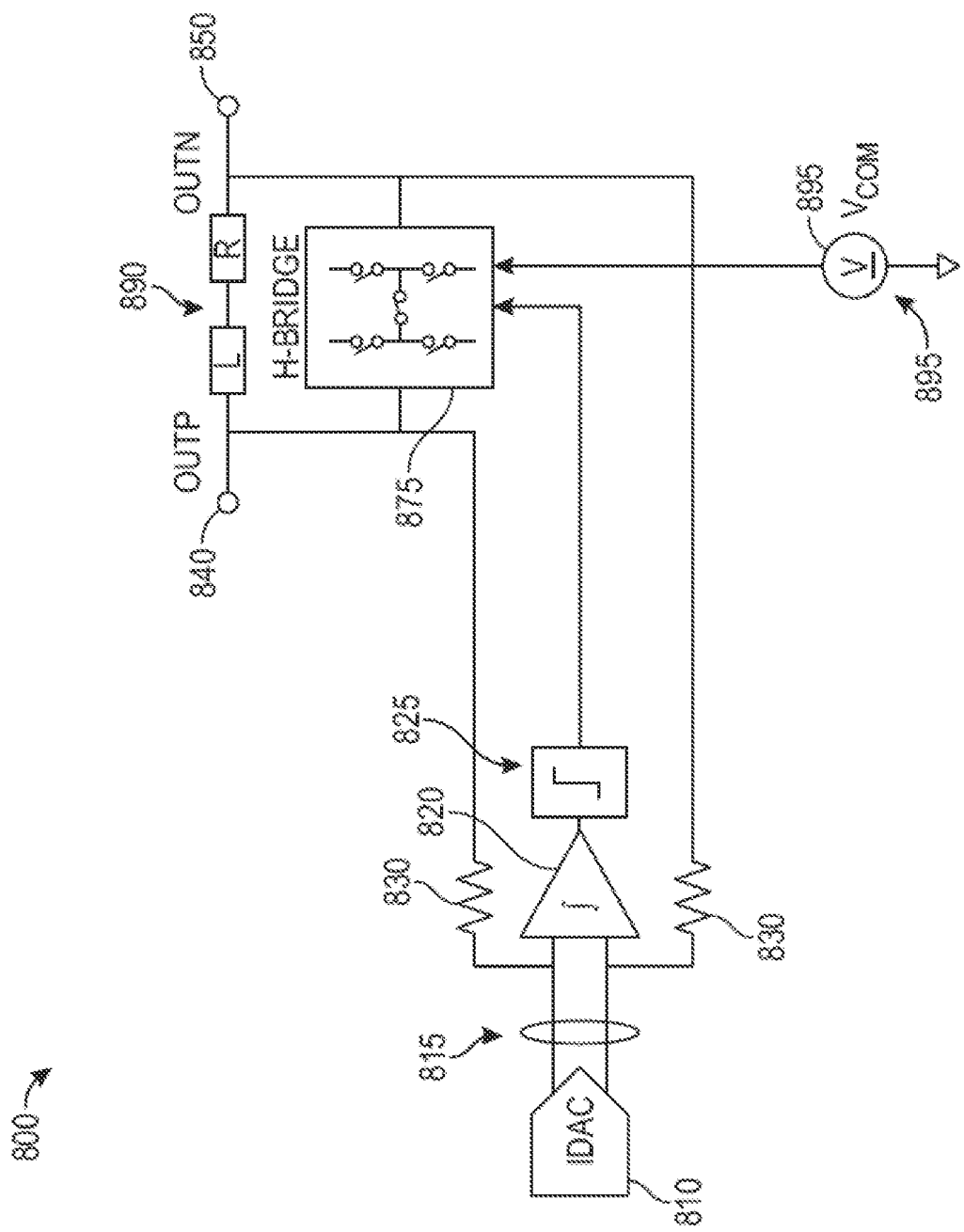
FIG. 8 is an exemplary circuit demonstrating common-mode control integrated with a modulator, in accordance with some embodiments of the disclosure provided herein.

FIG. 8 is an exemplary circuit demonstrating common-mode control integrated with a modulator 800, in accordance with some embodiments of the disclosure provided herein. Common-mode control integrated with a modulator 800 comprises IDAC 810, feedback resistors 830, integrator 820, Vcom voltage source 895, summing node 815, load 890, positive output 840, negative output 850, and H-bridge 875.

In one or more embodiments, the IDAC 810 is a digital to analog current source. Specifically, IDACs are used to create an analog current based on input from a digital signal or register, etc. Integrator 820 is as known in the art.

Following the integrator 820 is a quantizer 825, which quantizes the integrated output, generating a quantized value. In this example, the quantizer output includes a 3-level signal. In some examples, FIG. 8 illustrates a class-D amplifier. The load 890 is a speaker load connected to outp and outn and the Vcom voltage source 895 and H-bridge 875 are connected as shown in FIG. 7.

In this embodiment, a well-stabilized common mode may ease the design. It may additionally enable direct IDAC connection. It may additionally optimize op-amp performance/power thanks to the fixed CM range.

In one or more embodiments, a loop filter is used. However, in other embodiments, any suitable filters can be used. Summing node 815 is used in practice to combine the feedback from H-bridge 875 and IDAC 810. Modulator and/or quantizer 825 generate the H-bridge control signal to make the feedback signal equal to the current signal from IDAC.

Figure 9:
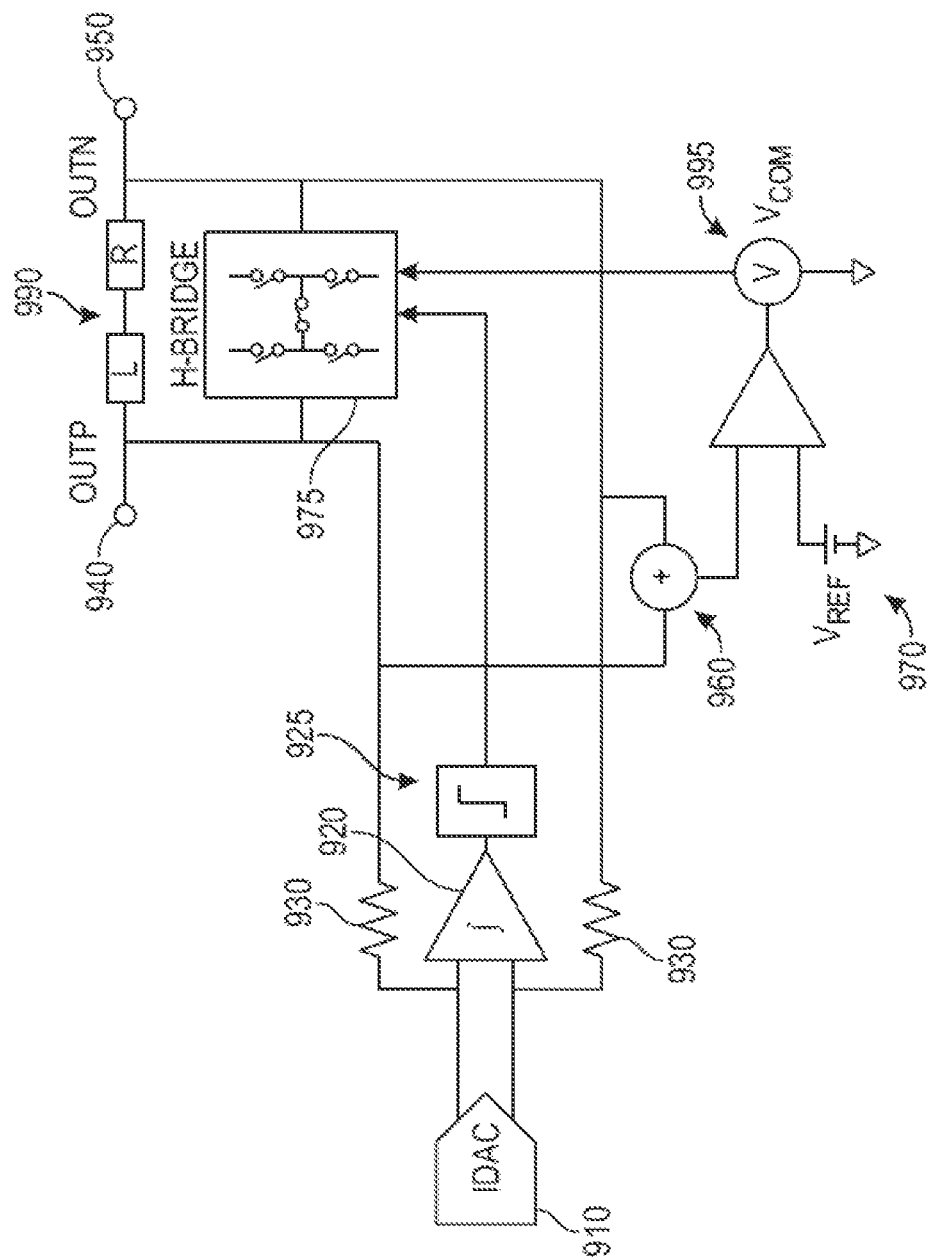
FIG. 9 is an exemplary circuit demonstrating common-mode control integrated with a modulator with common-mode feedback (CMFB), in accordance with some embodiments of the disclosure provided herein.

FIG. 9 is an exemplary circuit demonstrating common-mode control integrated with a modulator with common-mode feedback (CMFB), in accordance with some embodiments of the disclosure provided herein. The circuit having common-mode control integrated with a modulator 900 includes IDAC 910, feedback resistors 930, integrator 920, modulator 925, Vcom voltage source 995, load 990, positive output 940, negative output 950, adder 960, Vref voltage source 970 and H-bridge 975.

Adder 960 extracts common mode component from the outputs. When switches are closed (during transitions), the extracted common mode is compared with Vref 970 and compensated for differential amplifier. The output therefrom is negatively fed back to Vcom 995.

FIG. 9 depicts an example EMI reduction scheme. In this embodiment, Vcom voltage may be driven by putting it in a feedback loop. This embodiment may increase the accuracy of the output common mode, and common mode variations may be suppressed which may result in a reduction of EMI.

Figure 10:
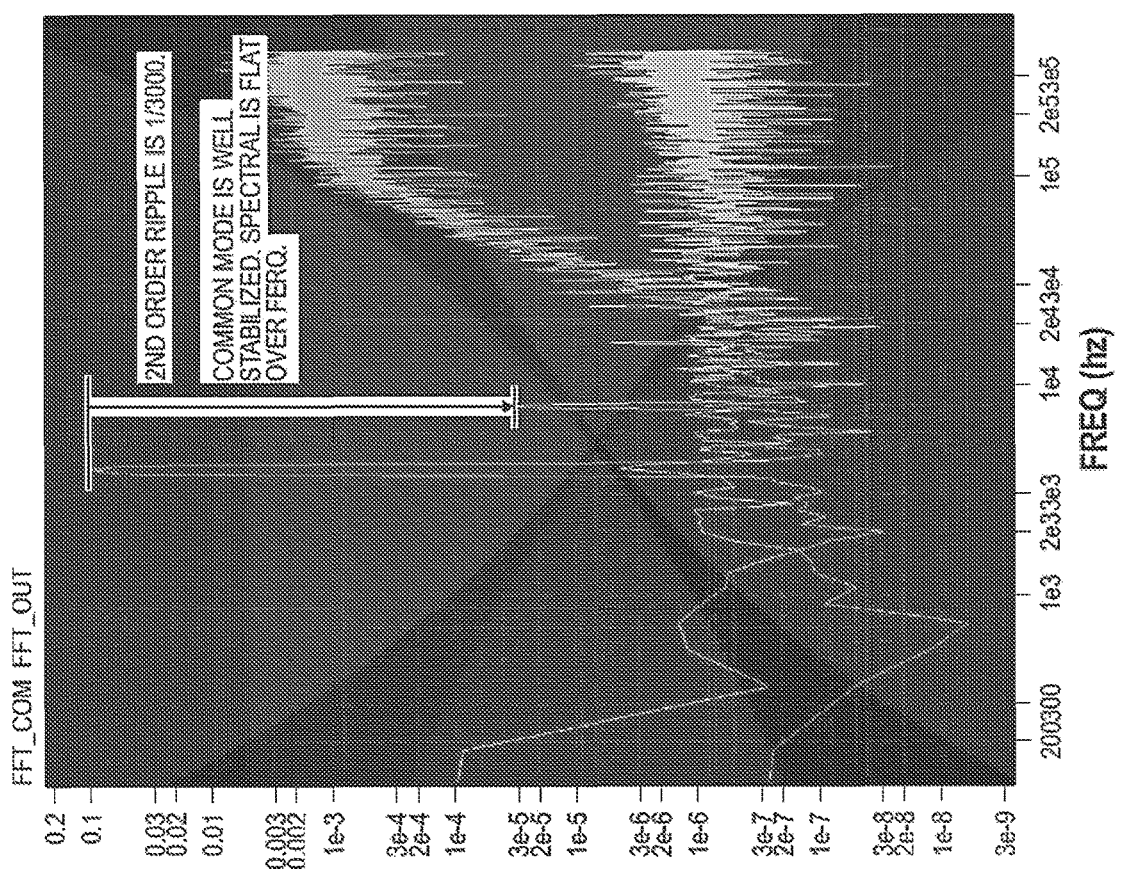
FIG. 10 illustrates an exemplary graph of a voltage input without CMFB, in accordance with some embodiments of the disclosure provided herein.

FIG. 10 illustrates an exemplary graph of differential and common mode output spectrum of FIG. 8, in accordance with some embodiments of the disclosure provided herein. Due to the common mode stabilization shown in FIG. 7, a spectrum of the common mode output is kept lower than a differential one and flat over the frequency range.

Figure 11:
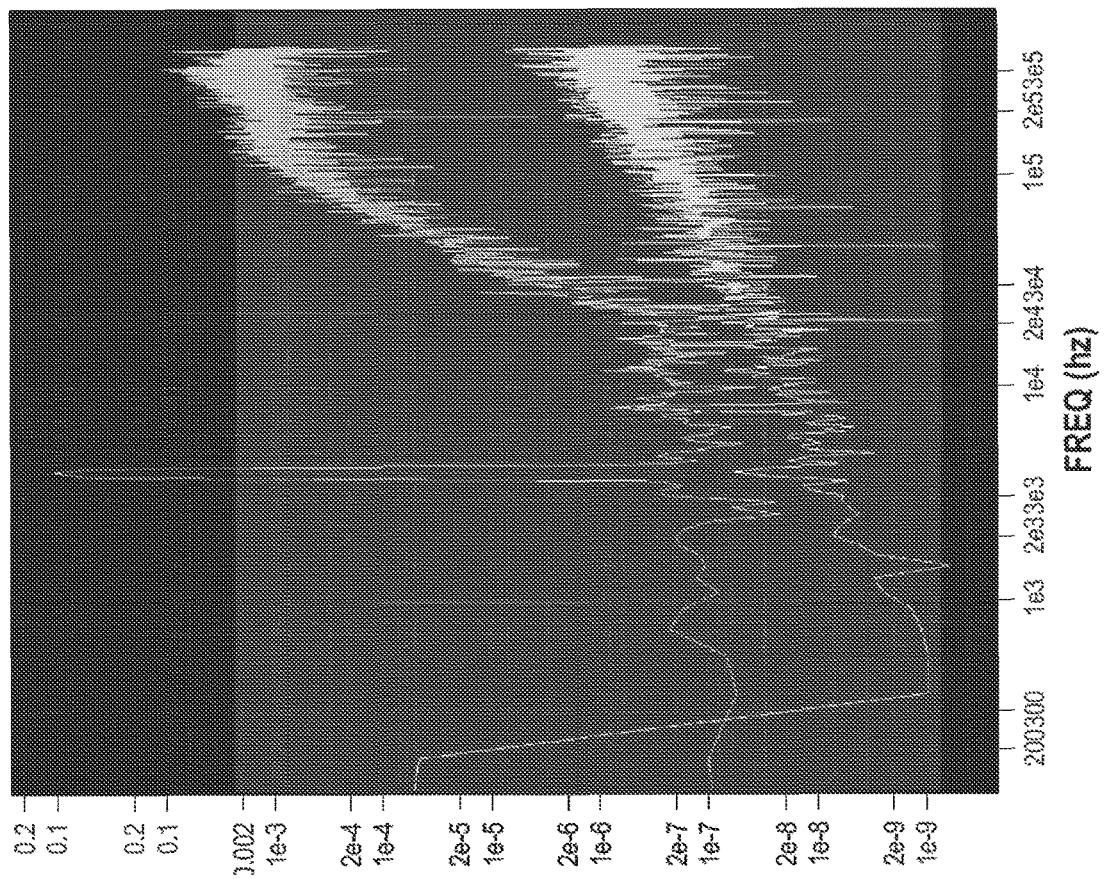
FIG. 11 illustrates an exemplary graph of current input, in accordance with some embodiments of the disclosure provided herein.

FIG. 11 illustrate an exemplary graph differential and common mode output spectrum with the common mode feedback shown in FIG. 9, in accordance with some embodiments of the disclosure provided herein. Due to the CMFB, the common mode spectrum at low frequency is suppressed even lower than that of FIG. 10.

Figure 12:
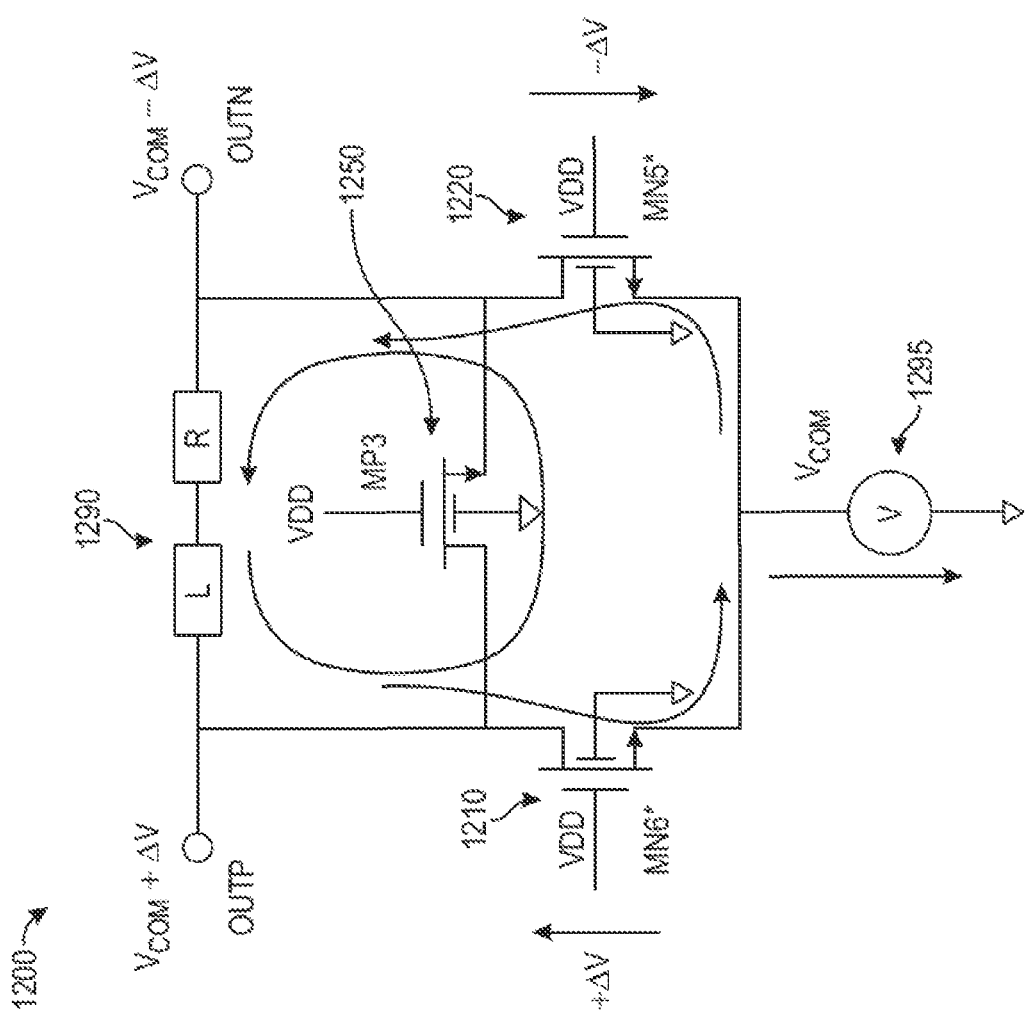
FIG. 12 illustrates an exemplary circuit with a mid-switch, in accordance with some embodiments of the disclosure provided herein.

FIG. 12 illustrates an exemplary circuit 1200 with a mid-switch 1250, in accordance with some embodiments of the disclosure provided herein. Simplified circuit 1200 comprises transistor 1210, transistor 1220, mid-switch 1250, Vcom voltage source 1295, and load 1290.

Embodiments herein may relate to establishing a very stable operating point of a H-bridge with a center shunt switch(es). Embodiments may have a variety of applications, such as, LVDS, PWM, class-D amplifiers, any differential amplification. However, application to arts not explicitly enumerated are not beyond the scope of the present invention.

Select Examples

Example 1 provides a circuit for setting a stable operating point comprising a first half bridge having a first output; a second half bridge having a second output; a shunt switch in electrical communication with the first and second outputs; a common mode voltage source; a first resistor and first switch disposed between the first output and common mode voltage source; and a second resistor and second switch disposed between the second output and common mode voltage source.

Example 2 provides a circuit according to one or more of the preceding and/or following examples, further comprising a load between the first and second output.

Example 3 provides a circuit according to one or more of the preceding and/or following examples, wherein common mode voltage source is configured to reduce EMI by dynamic driving.

Example 4 provides a circuit according to one or more of the preceding and/or following examples, wherein one or more of the half bridges comprise transistors.

Example 5 provides a circuit according to one or more of the preceding and/or following examples, wherein the transistors are at least one of PMOS, NMOS, BJT, and IGBT.

Example 6 provides a circuit according to one or more of the preceding and/or following examples, further comprising a feedback loop.

Example 7 provides a circuit according to one or more of the preceding and/or following examples, further comprising a voltage reference source.

Example 8 provides a system for setting a stable operating point in an H-bridge circuit comprising an IDAC; a modulator in electrical communication with the IDAC; and an H-bridge comprising: a first half bridge having a first output; a second half bridge having a second output; a shunt switch in electrical communication with the first and second outputs.

Example 9 provides a system according to one or more of the preceding and/or following examples, further comprising a common mode voltage source.

Example 10 provides a system according to one or more of the preceding and/or following examples, further comprising a first feedback resistor disposed between the first output and the modulator.

Example 11 provides a system according to one or more of the preceding and/or following examples, further comprising a second feedback resistor disposed between the second output and the modulator.

Example 12 provides a system according to one or more of the preceding and/or following examples, further comprising a feedback loop.

Example 13 provides a system according to one or more of the preceding and/or following examples, further comprising a voltage reference source.

Example 14 provides a system according to one or more of the preceding and/or following examples, wherein one or more of the half bridges comprise transistors.

Example 15 provides a system according to one or more of the preceding and/or following examples, wherein the transistors are at least one of PMOS, NMOS, BJT, and IGBT.

Example 16 provides a system according to one or more of the preceding and/or following examples, wherein the feedback can be continuous.

Example 17 provides a system according to one or more of the preceding and/or following examples, wherein the feedback can be discrete time.

Example 18 provides a system for setting a stable operating point comprising: an IDAC; an integrator coupled to the IDAC configured to receive an IDAC output and a feedback signal; a quantizer coupled to the integrator configured to receive and integrator output and generate a quantized signal; and an H-bridge configured to receive the quantized signal, comprising: a first half bridge having a first output; a second half bridge having a second output; and means for stabilizing an operating point of the H-bridge.

Example 19 provides a system according to one or more of the preceding and/or following examples, wherein the means for stabilizing the operating point include a shunt switch in electrical communication with the first and second outputs.

Example 20 provides a system according to one or more of the preceding and/or following examples, further comprising a common mode voltage source; a first resistor and first switch disposed between the first output and the common mode voltage source; and a second resistor and second switch disposed between the second output and the common mode voltage source.

Example 21 includes or relates to a method to set common mode of an H-bridge with a center-shunt switch, in accordance with various embodiments or examples herein.

Example 22 includes or relates to an EMI reduction scheme by dynamically driving Vcom, in accordance with various embodiments or examples herein.

Example 23 relates to any of examples 1-22, or some other example, and further relating to a type of transistor forming an H-bridge or center switch (PMOS, NMOS, BJT, or IGBT), in accordance with various embodiments or examples herein.

Example 24 relates to any of examples 1-23, or some other example, and further relating to a type of common mode forcing resistor (by switch PMOS, NMOS, CMOS, switch+resistor, or resistor continuously connected), in accordance with various embodiments or examples herein.

Example 25 relates to any of examples 1-24, or some other example, and further relating to driving Vcom with a DC value, in accordance with various embodiments or examples herein.

Example 26 relates to any of examples 1-25, or some other example, and further relating to Vcom being a current sink or source, in accordance with various embodiments or examples herein.

Example 27 relates to any of examples 1-26, or some other example, and further relating to Vcom being a clocked source, in accordance with various embodiments or examples herein.

Example 28 includes an apparatus that includes or relates to any of examples 1-27, or some other concepts or embodiments discussed herein.

Example 29 includes an apparatus comprising means to implement any of examples 1-29, or some other concepts or embodiments discussed herein.

Example 30 includes a method for implementing or manufacturing any of examples 1-29, or some other concepts or embodiments discussed herein.

Example 31 includes one or more non-transitory computer-readable media comprising instructions that, upon execution of the instructions by an electronic device, are to cause the electronic device to implement or manufacture any of examples 1-30, or some other concepts or embodiments discussed herein.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Interpretation of Terms

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B);

in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

What is claimed is:

1. A circuit for setting a stable operating point comprising:
   a first half bridge having a first output;
   a second half bridge having a second output;
   a shunt switch in electrical communication with the first and second outputs;
   a common mode voltage source coupled between a first node and a reference node;
   a first resistor coupled in series with a first switch, wherein the first resistor and the first switch are disposed between the first output and the first node; and
   a second resistor coupled in series with a second switch, wherein the second resistor and the second switch are disposed between the second output and the first node, and wherein the first switch and the second switch are coupled, via the first node, to the common mode voltage source.

2. The circuit according to claim 1, further comprising a load between the first and second output.

3. The circuit according to claim 1, wherein the common mode voltage source is configured to reduce EMI by dynamic driving.

4. The circuit according to claim 1, wherein one or more of the half bridges comprise transistors.

5. The circuit according to claim 4, wherein the transistors are at least one of PMOS, NMOS, BJT, and IGBT.

6. The circuit according to claim 1, further comprising a feedback loop.

7. The circuit according to claim 6, further comprising a voltage reference source.

8. A system for setting a stable operating point in an H-bridge circuit comprising:
   an IDAC;
   a modulator in electrical communication with the IDAC; and
   an H-bridge comprising:
      a first half bridge having a first output;
      a second half bridge having a second output;
      a shunt switch in electrical communication with the first and second outputs;
      a common mode voltage source coupled between a first node and a reference node;
      a first resistor coupled in series with a first switch, wherein the first resistor and the first switch are disposed between the first output and the first node; and
      a second resistor coupled in series with a second switch, wherein the second resistor and the second switch are disposed between the second output and the first node, and wherein the first switch and the second switch are coupled, via the first node, to the common mode voltage source.

9. The system according to claim 8, further comprising a first feedback resistor disposed between the first output and the modulator.

10. The system according to claim 8, further comprising a second feedback resistor disposed between the second output and the modulator.

11. The system according to claim 10, further comprising a feedback loop.

12. The system according to claim 11, further comprising a voltage reference source.

13. The system according to claim 11, wherein one or more of the half bridges comprise transistors.

14. The system according to claim 13, wherein the transistors are at least one of PMOS, NMOS, BJT, and IGBT.

15. The system according to claim 11, wherein the feedback loop can be continuous.

16. The system according to claim 11, wherein the feedback loop can be discrete time.

17. A system for setting a stable operating point comprising:
   an IDAC;
   an integrator coupled to the IDAC configured to receive an IDAC output and a feedback signal;
   a quantizer coupled to the integrator configured to receive and integrator output and generate a quantized signal; and
   an H-bridge configured to receive the quantized signal, comprising:
      a first half bridge having a first output;
      a second half bridge having a second output;
      and means for stabilizing an operating point of the H-bridge;
      a common mode voltage source coupled between a first node and a reference node;

a first resistor coupled in series with a first switch, wherein the first resistor and the first switch are disposed between the first output and the first node; and a second resistor coupled in series with a second switch, wherein the second resistor and the second switch are disposed between the second output and the first node, and wherein the first switch and the second switch are coupled, via the first node, to the common mode voltage source.

18. The system of claim 17, wherein the means for stabilizing the operating point include a shunt switch in electrical communication with the first and second outputs.

19. The system according to claim 17, wherein the common mode voltage source is configured to reduce EMI by dynamic driving.

20. The system according to claim 17, further comprising a load between the first and second output.

\* \* \* \* \*